United States Patent [19]

Faxon

[11] 4,318,168
[45] Mar. 2, 1982

[54] OVER STRESS SENSE CIRCUIT FOR FLYBACK POWER SUPPLY

[75] Inventor: Merle W. Faxon, Kingston, N.H.

[73] Assignee: Raytheon Company, Lexington, Mass.

[21] Appl. No.: 163,679

[22] Filed: Jun. 27, 1980

[51] Int. Cl.³ .......................................... H02H 7/122
[52] U.S. Cl. ....................................... 363/56; 363/21; 363/97; 323/272; 361/18
[58] Field of Search .................................. 363/18–21, 363/24–26, 41, 50, 55–56, 97, 131; 323/272, 285; 307/237, 265, 266; 361/18, 87

[56] References Cited

U.S. PATENT DOCUMENTS

| | | | |
|---|---|---|---|
| 3,859,586 | 1/1975 | Wadlington | 363/56 |
| 3,873,903 | 3/1975 | Koetsch et al. | 363/25 |
| 4,031,453 | 6/1977 | Tevling | 363/20 |
| 4,063,307 | 12/1977 | Stephens | 363/21 |
| 4,150,425 | 4/1979 | Nagano et al. | 363/97 X |

Primary Examiner—William M. Shoop
Assistant Examiner—Peter S. Wong
Attorney, Agent, or Firm—Herbert W. Arnold; Joseph D. Pannone

[57] ABSTRACT

An overload protective circuit for direct current switching or flyback power supplies which senses for build up of internal transistor stress during operation of the main power transistor output stage. Normally, setting an internal overload limit for the main power transistor dissipation is difficult to achieve because the load current to be sensed is out of phase with input driver current. The invention provides for sensing a change in base drive input voltage during a departure from normal operating saturation of Baker clamped main power transistors and initiating a reduction in the width of the drive pulses to reduce internal transistor stress and to reduce power input prior to transistor damage.

15 Claims, 2 Drawing Figures

OVER STRESS SENSE CIRCUIT FOR FLYBACK POWER SUPPLY

BACKGROUND OF THE INVENTION

This invention relates to an over stress or overload protective circuit for use with output transistors in direct current power supplies of the switching or power flyback type, and more particularly to improved circuit means to protect power drive transistors of the power supply from excessive stress or internal power dissipation and consequent damage due to over stress during overload.

The application of overloads on drive or output transistors in a flyback or switching power supply necessitates automatic protective circuits which are fast acting to protect the output transistors and related equipment from damage due to over stress and other excessive current effects. The use of sensing circuits in an attempt to limit excessive power supply transistor stress of the main drive or output transistors during overload of a flyback power supply has been difficult to achieve because the load current circuit is out of phase with current applied to the driver for the main output transistors and output sensing occurs only after heavy output transistor current has resulted in damage. Another disadvantage of the usual sensing circuitry is the main power or switching transistors usually draw excess current prior to complete shut down in response to excess load resulting in interruption of output power as well as damage to the power transistors before the output sensing circuitry can stop the current build up. For example, when the power supply load becomes too heavy, the main power transistors draw heavy current and sensing of this current in the output circuit occurs too late to prevent damage due to stress.

Accordingly, it is an object of the invention to provide a novel circuit to protect a regulated transistor power supply from loads connected thereto from causing damage due to overload, particularly to the main power transistors.

Another object of the invention is to provide an improved protective circuit which avoids one or more of the disadvantages or limitations of the prior art arrangements.

A further object of the invention is to protect main power transistors and associated components in a direct current power supply, such as of the flyback type, from excessive stress or internal power dissipation due to current overload during operation of the power supply.

SUMMARY OF THE INVENTION

In accordance with the invention, the foregoing objects and related advantages are attained in an improved circuit for prevention of damage to main power or output transistors that may be incorporated in a typical transistorized regulated power supply of the flyback type in which energy into the output is obtained during transistor off time. In particular, protection against damage to the power supply or to the output transistors during overload, such as at start up of the power supply, is achieved by providing a current limit circuit using a Baker clamp circuit which couples the output load circuit of the main driver elements back, by way of a diode clamp circuit, to the base input circuit thereof and provides means for sensing any increase of the source of drive voltage to the main power transistors during current overload causing departure from normal operational saturation of the main power transistors. The diodes in the clamp circuit become non-conductive and are released from their clamping action due to collector voltage build up in the presence of a current overload. This tends to rapidly increase the width and amplitude of the drive voltage pulses applied to the power transistors. This increase in base drive voltage and build-up of stress in the transistors subsequent to pulling out of saturation is sensed by a sensing circuit which, in connection with a conventional controller, reduces the drive power at the input to the power transistors. This arrangement clamps back the width of the input drive pulses from the source to a series of narrow pulses thus reducing the on-time of the power transistors and also the power supply output voltage. In this manner, the input sensing circuit senses the Baker clamped input to determine when internal stress is being applied to the main power switching transistors and protects them from being over stressed by reducing the width of the drive pulses while permitting the main power supply to provide output power without interruption.

In its broader aspects, the invention contemplates the use of the anti-saturation characteristic of a Baker clamped circuit in conjunction with power transistors and the sensing of the rise in Baker clamped drive voltage to indicate when the power transistors are about to become over stressed and to limit or reduce the drive power before transistor damage can occur.

BRIEF DESCRIPTION OF THE DRAWINGS

For a better understanding of the invention, together with other and further objects thereof, reference is made to the accompanying drawings in which.

DESCRIPTION OF THE PREFERRED EMBODIMENTS

Figure 1:
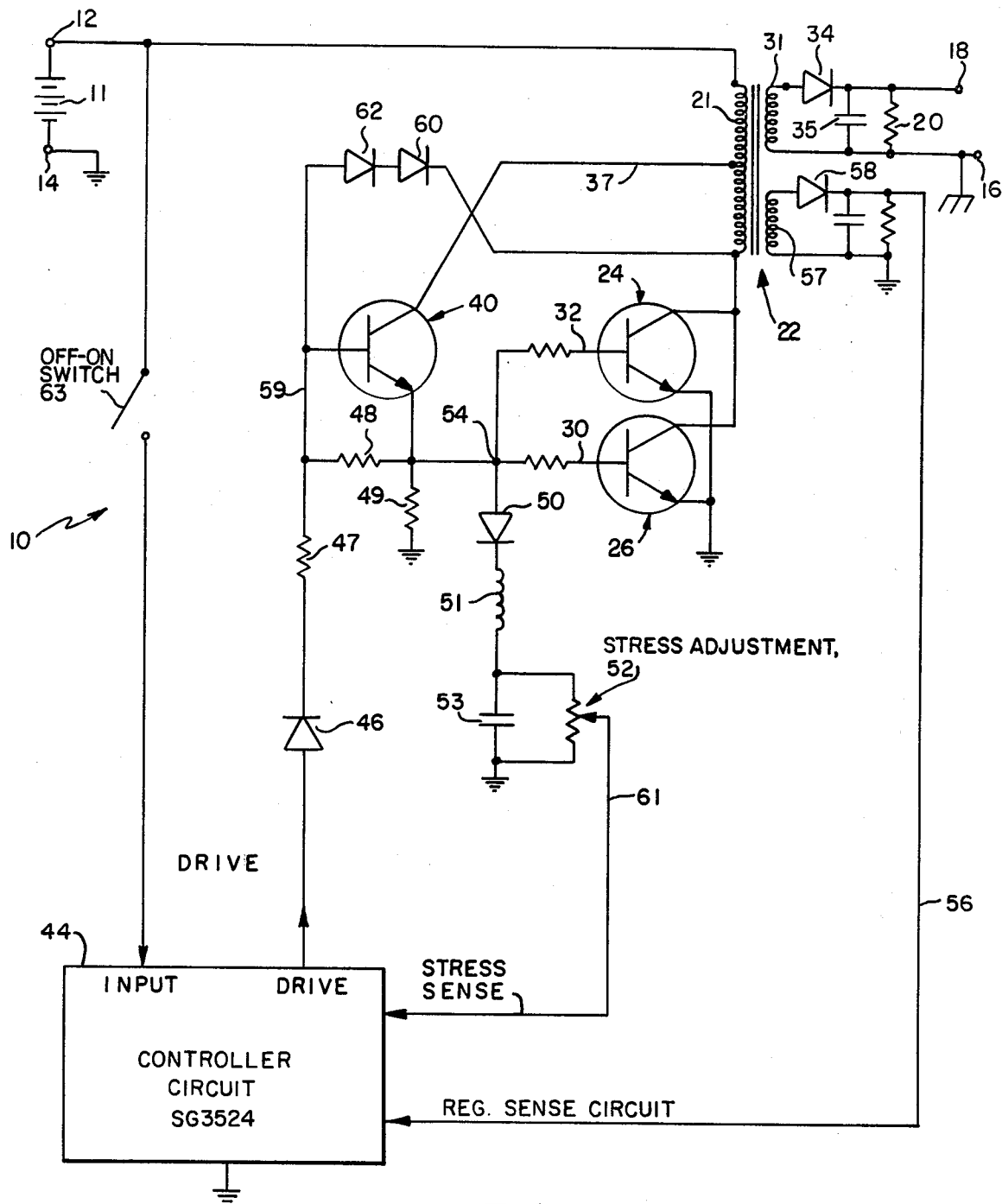
FIG. 1 is a schematic drawing of a direct current power supply employing the protective circuit of the present invention.

Referring now to FIG. 1, there is shown an over stress sense circuit 10 having a positive input terminal 12 and a negative input terminal 14 connected to receive a source of unidirectional voltage such as shown by direct current power source 11. The over voltage stress circuit 10 is provided with a negative output terminal 16 and a positive output terminal 18 for supplying output voltage to a load, represented as resistor 20. The negative input terminal 14 is shown isolated from the negative output terminal 16. Connected to the input terminal 12 is the primary winding 21 of main drive or output transformer 22 and the parallel collector outputs of main power or NPN-type output transistors 24 and 26, the emitters of the transistors being returned to the negative terminal 14 of the voltage source 11. Transformer 22 has a secondary or output winding 31 connected in circuit with a diode 34 and capacitor 35 to provide a rectified direct current at output terminals 16 and 18, capacitor 35 being selected at a value which tends to reduce ripple voltage at the output terminals. Connected to the input of output transistors 26 and 24 is a base drive transistor 40 having its collector electrode connected to a tap on primary transformer winding 21 by way of collector lead 37, the emitter of which is connected to the base 30 and 32, respectively, of main power transistors 26 and 24. The drive voltage from drive transistor 40 is applied to the base of each power transistor by way of a small sense resistor, for example, a 0.2 ohm series resistor, which permits the value of the drive voltage to be sensed and by means of a novel network to be described permits the sensing of stress on the main power transistors during overload and its adjustment to a limited value prior to a distructive build up. The base electrode of base drive transistor 40 is connected to a conventional integrated circuit controller 44 which generates a series of square wave or trigger pulses which cause each main power driver transistor to start conducting for the time in which pulses are applied from the controller 44. The output of controller 44 is connected to the base of transistor 40 by way of protective diode 46 and current limit resistor 47 which, in connection with resistors 48 and 49, form a bias circuit for the drive pulses applied from transistor 40 to the base of each of the output drive transistors. In order to sense the average drive voltage, a diode 50 in series with, for example, 100 microhenry ferrite choke 51 is connected to a stress adjustment potentiometer 52. The increase in voltage developed across capacitor 53 is sensed during overload. Normally, this voltage represents transistor stress which if not compensated, frequently damages the main power transistors. This undesirable condition of high or damaging circuit current is generally difficult to be limited by output sensing because the load current is out of phase with the driver current. That is, a reduced output due to overload would drive the transistors harder by way of the usual feedback loop. However, by the use of a pair of series-connected diodes 60 and 62 coupled from the collector output electrode of the main power transistors back to the base input of the driver stage, the driver output voltage is limited to a predetermined base drive source average voltage by the so called "Baker clamped" drive circuit. Setting the level for sensing this "Baker clamped" average drive voltage in a novel manner detects when operation in saturation terminates and when the width of the drive pulses from controller 44 is decreased due to a conventional shut down circuit (not shown) in controller 44. This occurs prior to damaging dissipation occurring in the main power transtors.

In operation, therefore, when the power supply is over loaded, the main power transistors 24 and 26 start to pull out of saturation, which condition of saturation usually permits efficient operation. This departure from or pulling out of saturation releases the Baker clamp diodes 60 and 62 causing them to become non-conductive due to the rise in the collector voltage of main power transistors 24 and 26. Current in lead 59 now flows only to the base of transistor 40 causing the average base drive source voltage at nodal point 54 to shoot upward, the initial peak being averaged out by the choke 51 and capacitor 53. When this happens, the circuit provides a sense feedback voltage on lead 61 due to average voltage build up across capacitor 53, whereby controller 44 terminates that specific output trigger pulse on line 59. The width of the subsequent drive voltage pulses on lead 59 to the base of drive transistor 40 are then adjusted by controller 44 to a narrow series of pulses as determined by the sense voltage on line 61. These narrow pulses protect the power transistors 24 and 26 until the overload ends by reducing their on-time, which reduces the energy in windings of transformer 22, and the power supply output voltage. In this novel manner, the circuit senses by way of lead 61 when excessive stress is about to be applied to the main power transistors and protects them from this stress by decreasing the output voltage of the power supply without interruption of output power such as normally occurs in other power supply circuits. Thus, when power switch 63 applies a direct current input voltage of, for example, 10 volts to the input of controller 44, narrow drive pulses are applied to the base of transistor 40 during overload. It should be understood that controller 44, in this embodiment, can, for example, comprise a semiconductor chip such as the model SG3524 transistor chip, manufactured by the Silicon General Company, 11651 Monarch Street, Garden Grove, Calif. 92641, and containing a well-known sensing shut down input terminal which is coupled to stress adjustment potentiometer 52. Controller 44 also contains well-known comparison circuitry with which the voltage at the input of feedback circuit 56 is compared to provide output control signals at separate terminals. The potentiometer 52 is normally adjusted to a pulse width equivalent to the maximum desired power input. When normal operation resumes, voltage regulation feedback for the entire power supply is provided on lead 56 from secondary winding 57 and diode 58 on transformer 22 to controller 44 which provides an appropriate direct current pulsed drive voltage on line 59. This drive voltage is generated for application to the base of drive transistor 40 and to conducting Baker clamp diodes 60 and 62 after well-known comparison with reference voltages have been made in controller 44 in connection with sense circuit 56. Thus, during an overload, pulse width is regulated by controller 44 in response to voltage on sense line 61 which controls until the overload is removed. At that point, the external conventional regulation loop for the entire power supply appearing on line 56 is used to regulate the input pulse width on line 59 from controller 44 according to well-known feedback principles.

Figure 2:
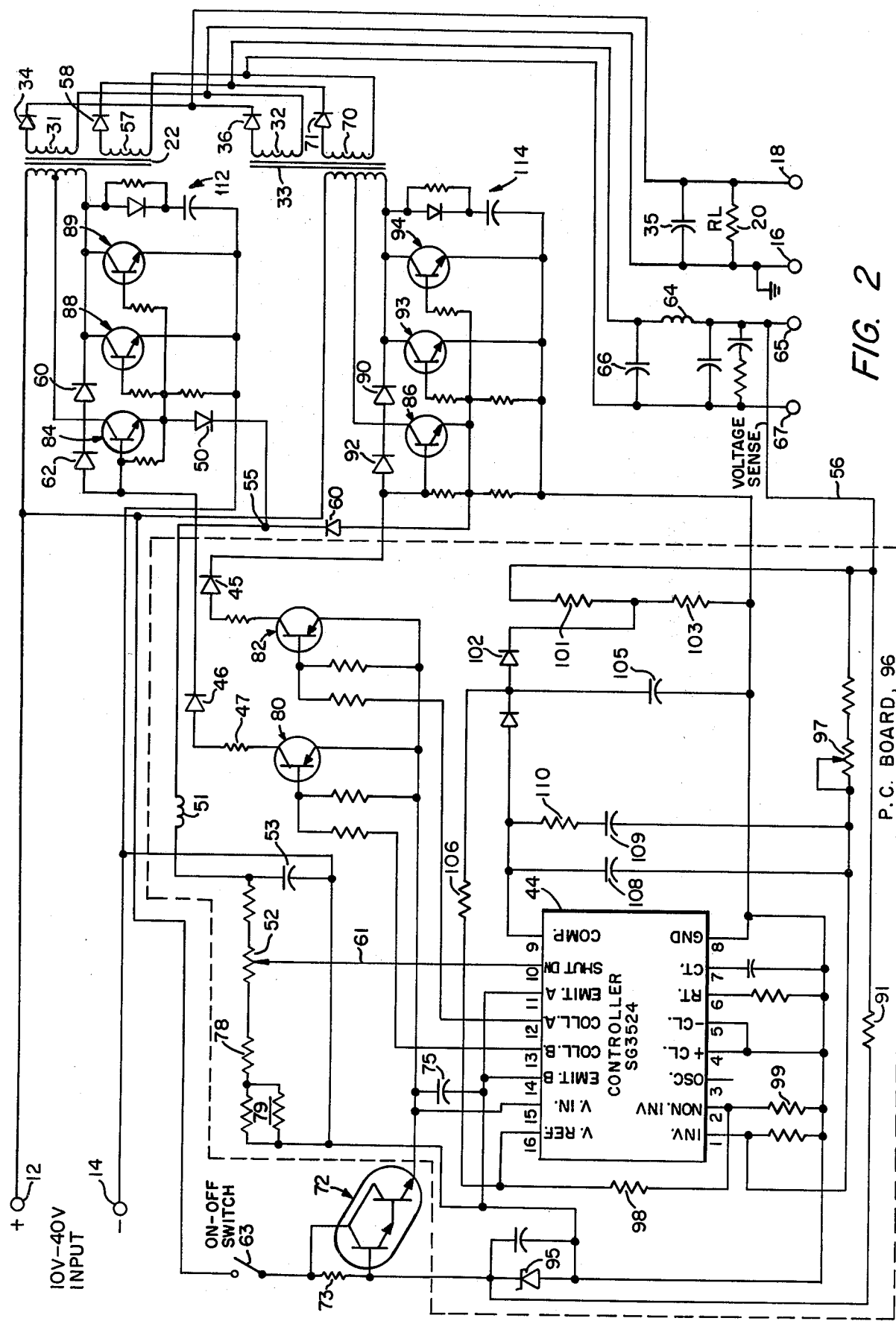
FIG. 2 is a complete schematic of the invention in accordance with the form of the invention shown in FIG. 1 but with further details.

Referring now to FIG. 2, there is shown another embodiment of an over stress protective circuit having similar functions as the circuit shown in FIG. 1 with the additional function of combining the dual output from separate parallel stages of Baker clamped transistors by means of connecting the secondary output and sense windings of one transistor stage, respectively, with the output and sense windings of the other stage. The over stress sensing circuits operate in substantially the same manner as that shown in FIG. 1 and corresponding parts of FIG. 2 bear the same reference numerals. For example, the output winding 31 and sense winding 57 of output transformer 22 forming the first transistor stage is shown coupled to include diode 34 and filter capacitor 35 in parallel with another output on secondary winding 32 and diode 36 of parallel coupled output transformer 33. Terminals 18 and 16 are shown supplying power to a load, $R_L$, represented by resistor 20, the negative side of the load being shown to be grounded. In like manner, the sense output winding 57 is connected to include diode 58, filter choke 64, and filter capacitor 66 to sense terminals 65 and 67. Output sense winding 70 of transformer 33 is connected by way of diode 71 in parallel with output sense winding 57 at the input circuit of choke 64 and filter capacitor 66 to form the combined output sense circuit across sense output terminals 65 and 67 and provides a combined output sense voltage of sense output windings 57 and 70 on feedback line 56. This parallel output arrangement of transformers 22 and 33 permits each stage of the power supply to operate in an independent manner while delivering combined power to the load.

The regulated sense voltage on line 56 is fed back by way of bleeder resistor 91 to a regulator Zener diode 95 and to the base input of a Darlington NPN transistor series pass regulator 72, its emitter output being connected to the voltage input terminal, V.in., at pin 15 of the conventional 3524 controller 44. The collector input or line voltage for the series pass transistor 72 is coupled by way of OFF-ON switch 63 to the positive DC input voltage terminal 12. In this manner, a regulated voltage for controller 44 is obtained. Amplifier 72 is biased, for example, by means of a 10 watt 470 ohm resistor 73 and does not form a part of control Printed Circuit board 96. The emitter of series pass transistor 72 is also connected to the emitters of drive amplifiers 80 and 82 and provides a regulated source of positive voltage. Capacitor 75 of, for example, 10 microfarads, at the output of series pass regulator 72 is for the purpose of reducing undesirable ripple. The outputs of amplifiers 80 and 82 are connected, respectively, to the base input of the driver amplifiers 84 and 86 for main power transistors 88 and 89, and 93 and 94. Sense voltage on sense circuit 56 is then compared in a manner to be described with a reference voltage from terminal 16, V.Ref., of controller 44 to provide a change in pulse width output, respectively, at pin terminals 13 and 12 connected to the base inputs of the drive amplifiers 80 and 82 in accordance with well-known module techniques. The sense voltage on line 56 is also fed by way of output voltage adjust potentiometer 97 to pin 1 of controller 44 for comparison with reference voltage applied from pin 16 into pin 2 at the junction of voltage divider resistors 98 and 99.

External sense voltage on line 56 is also applied to a slow start up circuit including voltage divider resistors 101 and 103, the center point of which is connected by way of an isolation diode 102 to capacitor 105 and resistor 106. This circuit prevents wide pulses from pins 12 and 13 driving amplifiers 80 and 82 during initial start up. This limits the width of the drive pulses during initial start up to a series of gradually widening pulses until the standard external voltage sense loop takes over control. Capacitor 105 is charged slowly through a large 33,000 ohm resistor 106 and thus limits the voltage compensation output at pin 9 during start up of controller 44. Pin 9 is also internally coupled to the pulse width modulator in controller 44, and the voltage at pin 9 controls the width of outputs at pins 12 and 13. Pin 9 is also connected to amplifier or gain tailoring capacitors 108 and 109 which, with resistor 110, adjust the gain versus frequency response of the internal amplifier feeding pins 12 and 13 in a well-known manner. The output at pins 12 and 13 are thus limited in width at the start of operation until the voltage of capacitor 105 gradually builds up to a value where voltage sense circuit 56 establishes control. Pins 6 and 7 of controller 44 form external frequency determining components of the internal oscillator which, in this embodiment, provides alternate twenty kilohertz trigger pulses on pins 12 and 13.

It should be noted that voltage from transformers 22 and 33, during normal unstressed transistor operation, is regulated by controller 44 in connection with voltage sense line 56 which in a known manner varies pulse width and output at pins 12 and 13. In this operational period, the transistors are operating in a saturated condition. Each Baker clamp circuit sets the voltage across each main power transistor when its serial connected diodes 60, 62, and 90, 92, respectively, are normally conducting. During a condition of excess dissipation or stress, such as during overload of the power supply, the output transistors pull out of saturation and this elevates their collector voltages in their output circuits. This increase of voltage due to non-conduction of the Baker clamp for both transistor stages appears at nodal point 55 and is applied across sense adjustment potentiometer 52 and is fed by line 61 to input pin 10 of controller 44. That is, the average Baker clamped drive voltage appears by way of choke 51 across capacitor 53. This average voltage across capacitor 53, a portion of which voltage reaches the limit set by stress adjustment potentiometer 52, occurs when output transistor operation in saturation terminates. That portion of the average voltage across capacitor 53 is then fed back by way of lead 61 to shutdown pin 10 of controller 44. The controller then, in a well-known manner, terminates the specific output trigger pulses applied to driver amplifier 84 by way of conventional isolation diode 46 and transistor 80. Diodes 50 and 60, in connection with choke 51, ensures that the average voltage for both stages appears across capacitor 53 rather than the momentary peak voltage occurring when output transistors 88 and 89 and 93 and 94 return back to saturation which causes a small voltage spike at the input to driver transistors 84 and 86. This normally occurs before the power output transistors reach saturation at the start of an operation cycle. The output of the pin 12 of controller 44 is connected to the base input of transistor 86 by way of isolation diode 45 which prevents unwanted reverse current flow into amplifier 82.

In particular, the Baker clamped drive voltage output of driver transistor 86 is combined by way of isolation diode 60 with voltage at nodal point 55 coming from the base input of the first stage transistors 88 and 89 by way of corresponding isolation diode 50. Thus, the combined sense voltage of both stages, by way of choke input filter 51, is stored in capacitor 53 and applied across a sensing voltage divider network including potentiometer 52, resistors 77, 78 and parallel set of resistors 79 for thermal control. This arrangement develops an average voltage across the stress capacitor 53 which is sensed by controller 44 across pins 10 and 11. When the voltage across pin 10 with respect to 11 exceeds the threshold set by potentiometer 52, which occurs sooner or later, as determined by its setting, the width of the drive pulses on leads 12 and 13 are narrowed to provide only the current input initially set up by potentiometer 52 in the presence of an applied temporary overload. This setting prevents excessive stress of the output transistors during subsequent operation. At the conclusion of the operational output overload, the internal control loop, due to a lowered sense voltage on pin 10, ceases to adjust pulse widths and, according to well-known module techniques, such control of width is taken over by voltage on external sense line 56 and pin 1 during normal operation of the regulator. Well-known turn off snubber circuits 112 and 114, each includes a diode resistor and capacitor. During turn off of the output transistors at the end of each pulse, the capacitors limit the turn off power dissipated by the power transistors.

The invention is not limited to the particular details of construction or materials described as many equivalents will suggest themselves to those skilled in the art. It is accordingly desired that the invention not be limited to the particular details of the embodiment disclosed herein except as defined by the appended claims.

What is claimed is:

1. A protective circuit for preventing the load current in a switching power supply from exceeding a predetermined limit comprising:
   a power transistor coupled to an output load circuit;
   a drive transistor coupled to the input of said power transistor;
   a source of drive voltage pulses applied to the input of said drive transistor to provide a drive voltage;
   circuit means including a Baker clamp diode coupled from the output load circuit of the power transistor to the input of said drive transistor to provide a clamped drive voltage;
   means for sensing the average voltage increase of said clamped drive voltage at the output of said drive transistor applied to the input of said power transistor above a predetermined limit in response to non-conductivity of said Baker clamp diode upon termination of saturation of said power transistor during overload of said power transistor; and
   means in response to said increase in drive voltage above said limit to decrease the width of said drive voltage pulses to reduce the input of said power transistor, whereby the on-time of said power transistor is reduced to a value below said predetermined limit.

2. A power supply comprising:
   a plurality of amplifying power transistors connected in circuit with the primary windings of an output transformer;
   a controller adapted to produce a series of drive pulses;
   a protective clamp circuit coupled from the output electrodes of said power transistors to the input circuit of said power transistors, said clamp circuit adapted to be non-conductive in the presence of overload applied to said power transistors; and
   voltage sense circuit means including a diode, series coupled inductance and capacitor coupled in the input circuit of said controller and adapted to sense the average voltage at the input of said power transistors to actuate said controller to clamp back said drive pulses to a relatively narrow width in response to said sense circuit means sensing during said overload an increase in drive voltage upon non-conductivity of said clamp circuit at termination of saturation of said power transistors, thereby protecting said transistors from internal stress overload by reducing the on-time of said power transistors while said power supply continues to supply reduced power to said transformer windings.

3. The apparatus as set forth in claim 2 wherein:
   said protective clamp circuit includes a plurality of series connected diodes coupled from the output circuit of each of said power transistors to the input electrodes thereof and poled in a direction to reduce the amplitude of said drive voltage pulses.

4. A protective circuit for preventing damage to power transistors in a switching power supply comprising:
   a power transformer having primary and secondary windings;
   a pair of power transistors;
   a drive transistor coupled to the input of said pair of power transistors;
   an output circuit for said power transistors, the output electrodes of which are coupled to the primary winding of said power transformer;
   an input circuit for said power transistors adapted to be connected to a drive source voltage by way of said drive transistor to operate said power transistors in a state of saturation;
   a control circuit adapted to provide said drive source voltage by way of a series resistor to the input electrodes of said drive transistor;
   a clamp circuit including series-connected diodes coupled from the output electrodes of said power transistors to an input circuit of said drive transistor;
   said clamp circuit adapted to increase the average input drive source voltage pulses in response to non-conductivity of said diodes upon the withdrawing from said state of saturation of said power transistors during overload of said power supply; and
   sensing means coupled from the junction of the output of said drive transistor to the input circuit including said series resistor for said power transistors to said control circuit for limiting the width of said drive source voltage pulses to prevent damage to said power transistors during said overload with reduced output of said power supply.

5. A protective circuit for preventing load current in a switching power supply from exceeding a predetermined limit comprising:
   a pair of input terminals for connection to a source of direct current;
   a pair of output terminals;
   an output transformer having a secondary winding adapted to be coupled to said pair of output terminals for supplying output voltage;
   a primary winding on said output transformer coupled in circuit with said input terminals;
   a sense winding on said output transformer;
   a controller adapted to produce a series of drive voltage pulses, the width of which varies according to a sense voltage applied to a sense terminal of said controller circuit;
   power transistors coupled to said primary winding of said output transformer and adapted during non-conduction to supply energy to said output winding;
   a drive transistor having an output electrode coupled to the input of said power transistors and another electrode connected to said primary winding;
   a clamp circuit including series-connected diodes connected from the junction of the winding and said other electrode of said power transistors to the input of said drive transistor and poled to provide a clamped drive voltage during normal operation in saturation of said power transistors;
   means including a storage circuit for sensing the average voltage increase of said clamped drive voltage above a predetermined limit in response to non-conduction of said clamp circuit upon termination of said saturation during overload of said power supply;
   means in response to said increase in drive voltage above a predetermined limit during current overload of said power transistors to apply said sensed voltage to said sense terminal of said controller to decrease the width of said drive voltage pulses applied to the input of said drive transistor from said controller circuit, whereby the on time of said power transistors is reduced to a value below said preset limit;

said sensing means including a potentiometer connected from the input of said power transistors to said sense terminal of said controller to terminate pulses of a width tending to produce stress in said power transistors; and means including said sense winding on said output transformer to provide a regulating voltage to said controller adapted to regulate the width of said drive pulses during normal unstressed operation of said power transistors.

6. The apparatus as set forth in claim 5 wherein: the regulating voltage developed by said sense winding on said transformer is applied to said controller to regulate the width of said drive pulses upon termination of operation of said sensing circuit means.

7. In combination:

a power transistor coupled to an output load circuit adapted during normal load to operate in a state of saturation;

a drive transistor coupled into the input of said power transistor and adapted to provide a drive output which varies in accordance with the width of drive pulses applied thereto;

a voltage clamp circuit coupled from said output load circuit of the power transistor to the input of said drive transistor to provide a clamped drive voltage; and means during overload of said power transistor for sensing the average voltage increase of said clamped drive voltage in response to non-conduction of said voltage clamp circuit during pulling out of said saturation to provide a control signal for reducing the width of said drive pulses.

8. The combination of claim 7 wherein:

said voltage clamp circuit includes series-coupled diodes poled in a direction to maintain an alternate path for input drive pulses to said output load circuit during conductivity of said diodes.

9. The combination of claim 7 wherein:

the voltage clamp circuit is coupled as a Baker clamp.

10. In combination:

a power transistor adapted to be coupled to an output load circuit and to operate in a state of saturation during normal load;

a drive transistor coupled to the input of said power transistor and adapted to provide an output from said power transistor in accordance with the width of drive pulses applied thereto;

a Baker clamp circuit including diodes coupled from the output of said power transistor to the input of said drive transistor; and means for sensing an increase in voltage at the driver output of said drive circuit in response to termination of said state of saturation upon non-conductivity of said diodes during overload to provide a control signal for reducing the width of said drive pulses.

11. In combination:

a power transistor coupled to an output load circuit;

a drive transistor coupled to the input of said power transistor to provide a drive output which varies in accordance with the width of drive pulses applied thereto;

a clamp circuit including a plurality of diodes coupled in series from the output load circuit of the power transistor to the input of said drive transistor to provide a clamped drive voltage during operation of said power transistor in saturation;

means for sensing an increase in voltage at the junction of the drive circuit and the power transistor in response to non-conduction of said clamp circuit in response to said power transistor pulling out of normal operating saturation during overload of said power transistor; and means in response to said sensed increase in voltage to provide a control signal at the input of said drive transistor for reducing the width of said drive pulses applied to the input of said power transistor.

12. A protective circuit for preventing the load current in a switching power supply from exceeding a predetermined limit comprising:

a power transistor coupled to an output load circuit and adapted to operate in saturation in the absence of an overload;

a drive transistor coupled to the input of said power transistor and adapted to provide a drive output which varies in accordance with the width of drive pulses applied thereto;

a clamp circuit including series-connected diodes coupled from the output power transistor to the input of said drive transistor, said diodes of a polarity to provide a clamped drive voltage;

means for sensing an average voltage increase of said clamped drive voltage above a predetermined limit due to non-conduction of said diodes upon termination of saturation in said power transistor due to an overload in said output load circuit; and means in response to said sensed increase of said clamped drive voltage to reduce the width of said drive voltage pulses to a value below said predetermined limit.

13. The apparatus as set forth in claim 13 in which said means for sensing the average voltage increase of said clamped drive voltage includes a potentiometer for setting said predetermined limit for said sensed average voltage.

14. A protective circuit for preventing excessive stress in a power transistor comprising:

means for operating said power transistor in saturation to provide power to a load circuit;

means including a diode Baker clamp circuit coupled from the output of said power transistor to the input thereof; and means for sensing the rise in voltage at the input to said Baker clamp circuit due to non-conduction thereof when said power transistor terminates saturation upon overload applied to said load circuit to provide a control signal for reducing drive power applied to the input of the power transistor.

15. The combination of claim 7 wherein:

said output load circuit is coupled to a plurality of parallel coupled power transistors.

* * * * *